(12) United States Patent
Yamada et al.

(10) Patent No.: US 12,160,099 B2
(45) Date of Patent: Dec. 3, 2024

(54) OVERVOLTAGE PROTECTION CIRCUIT

(71) Applicant: MegaChips Corporation, Osaka (JP)

(72) Inventors: Yuta Yamada, Chiba (JP); Takashi Ikeda, Chiba (JP)

(73) Assignee: MegaChips Corporation, Osaka (JP)

( * ) Notice: Subject to any disclaimer, the term of this patent is extended or adjusted under 35 U.S.C. 154(b) by 197 days.

(21) Appl. No.: 17/929,537

(22) Filed: Sep. 2, 2022

(65) Prior Publication Data

US 2023/0070941 A1 Mar. 9, 2023

(30) Foreign Application Priority Data

Sep. 3, 2021 (JP) ................................. 2021-143952

(51) Int. Cl.
*H02H 3/20* (2006.01)
*H02H 1/00* (2006.01)

(52) U.S. Cl.
CPC ............ *H02H 3/20* (2013.01); *H02H 1/0007* (2013.01)

(58) Field of Classification Search
CPC .. H02H 3/20; H02H 1/0007; H03F 2200/441; H03F 2200/444; H03F 1/52; H03G 11/02
USPC ................................................ 361/91.1, 91.5
See application file for complete search history.

(56) References Cited

U.S. PATENT DOCUMENTS

| 4,138,612 | A | 2/1979 | Schlesinger | |
|---|---|---|---|---|
| 5,714,900 | A | 2/1998 | Ehlers | |
| 2002/0186572 | A1 * | 12/2002 | Nishida | H02M 3/3385 363/21.16 |

(Continued)

FOREIGN PATENT DOCUMENTS

| CN | 203405753 U | * | 1/2014 |
|---|---|---|---|
| CN | 104917403 A | * | 9/2015 |

(Continued)

OTHER PUBLICATIONS

Extended European Search Report issued in European Application No. 22193479.7, dated Jan. 30, 2023 (9 pages).

*Primary Examiner* — Dharti H Patel
(74) *Attorney, Agent, or Firm* — Osha Bergman Watanabe & Burton LLP

(57) ABSTRACT

There is provided a to-be-protection circuit that is high in operation accuracy and that prevents overvoltage on a protected circuit. A protection circuit is configured to protect a to-be-protected circuit from overvoltage. The to-be-protected circuit is connected to an external output terminal. The protection circuit includes: a current path unit connected to the external output terminal and including at least one first element; a reference voltage generation unit which generates and outputs a reference voltage; and an amplifier circuit outputs a target voltage based on a difference between a first input voltage and a second input voltage. The amplifier circuit operates using the reference voltage as the first input voltage and using a feedback voltage based on the target voltage as the second input voltage, and outputs the target voltage to the current path unit. The reference voltage generation unit includes at least one second element having an operating characteristic corresponding to an operating characteristic of the at least one first element of the current path unit, and generates the reference voltage based on a voltage drop caused by the at least one second element.

17 Claims, 7 Drawing Sheets

(56) References Cited

U.S. PATENT DOCUMENTS

| | | | | |
|---|---|---|---|---|
| 2007/0046363 | A1* | 3/2007 | Tanzawa | G05F 3/30 |
| | | | | 327/539 |
| 2008/0192391 | A1* | 8/2008 | Inoue | H01L 27/0248 |
| | | | | 361/18 |
| 2009/0096437 | A1* | 4/2009 | Wei | H02M 7/10 |
| | | | | 323/299 |
| 2010/0090652 | A1* | 4/2010 | Takeda | H01M 10/486 |
| | | | | 320/134 |
| 2014/0232271 | A1* | 8/2014 | Wiegele | H05B 45/3725 |
| | | | | 315/127 |
| 2015/0084674 | A1* | 3/2015 | Tatsumi | H03K 5/125 |
| | | | | 327/50 |
| 2016/0218499 | A1* | 7/2016 | Ji | H01L 27/0292 |

FOREIGN PATENT DOCUMENTS

| | | | | | |
|---|---|---|---|---|---|
| CN | 206060565 | U | * | 3/2017 | |
| DE | 10009755 | A1 | * | 10/2000 | ......... H03K 17/0822 |
| JP | S63-124721 | A | | 5/1988 | |
| JP | H0823784 | B2 | | 3/1996 | |
| JP | 2008117254 | A | * | 5/2008 | ............. G05F 1/573 |
| JP | 2009159800 | A | * | 7/2009 | |
| JP | 2010175522 | A | * | 8/2010 | |
| JP | 2011014945 | A | * | 1/2011 | ......... H05B 33/0827 |
| WO | WO-2022190905 | A1 | * | 9/2022 | ............... H02H 3/20 |

* cited by examiner

OVERVOLTAGE PROTECTION CIRCUIT

TECHNICAL FIELD

The present invention relates to protection circuits, and more particularly relates to a protection circuit that protects a to-be-protected circuit from overvoltage.

BACKGROUND ART

In operation of a current output amplifier, when a load larger than expected is applied to an output of the amplifier, an overvoltage state may occur to damage the amplifier. Therefore, in order to protect the amplifier from such overvoltage, a protection circuit is generally used for preventing the occurrence of such overvoltage. A clamp circuit is known as a circuit that clamps a level of voltage within a certain voltage range to prevent input of an overvoltage into a circuit to be protected (a to-be-protected circuit), thereby protecting the to-be-protected circuit.

For example, Patent Document 1 discloses a clamp circuit capable of setting clamp voltages. Specifically, Patent Document 1 discloses a clamp circuit that sets positive and negative clamp voltages with respect to a reference voltage using a constant current source and a plurality of diodes, and outputs stable clamp voltages using two buffer circuits composed by a unity gain amplifier.

CITATION LIST

Patent Literature

Patent Document 1: JP 8-23784 B

SUMMARY OF INVENTION

Technical Problem

However, in a case where operation accuracy of a protection circuit is low due to influence of process variation and temperature characteristics, it is necessary to set a level of protection voltage in such a way as to compensate for this, and therefore, there is a problem that a dynamic range of a to-be-protected circuit is sacrificed. Among others, a problem arises that in a case where a protection circuit is configured by external components, the external components have process variation different from that of elements forming a protection circuit and thus the temperature characteristics thereof are not stable, the operation accuracy is significantly lowered, and in order to cope with this, the cost is increased more than necessary.

The clamp circuit disclosed in Patent Document 1 requires a power supply voltage equal to or higher than the protection voltage in its operation. Further, since the clamp circuit sets the positive and negative clamp voltages by using the string configuration in which the diode elements are simply connected in series, the clamp voltages tend to depend on process variation and temperature characteristics of the diode elements, and therefore, the operation accuracy is insufficient.

Therefore, it is an object of the present invention to provide a protection circuit that is not easily affected by process variation and temperature characteristics and thus is high in operation accuracy and that prevents overvoltage on a to-be-protected circuit.

Further, it is an object of the present invention to provide a protection circuit that allows a protection voltage to be set to a voltage equal to or higher than a power supply voltage and to arbitrarily adjust the protection voltage.

Solution to Problem

In order to solve the problems described above, the present invention is configured by including invention specifying matters and technical features.

The present invention according to one aspect is a protection circuit configured to protect a to-be-protected circuit from overvoltage. The to-be-protected circuit is connected to an external output terminal. The protection circuit includes: a current path unit connected to the external output terminal and including at least one first element; a reference voltage generation unit which generates and outputs a reference voltage; and an amplifier circuit which outputs a target voltage based on a difference between a first input voltage and a second input voltage. The amplifier circuit operates using the reference voltage as the first input voltage and using a feedback voltage based on the target voltage as the second input voltage, and outputs the target voltage to the current path unit. The reference voltage generation unit includes at least one second element having an operating characteristic corresponding to an operating characteristic of the at least one first element of the current path unit, and generates the reference voltage based on a voltage drop caused by the at least one second element.

The current path unit may determine a protection voltage at the external output terminal based on the target voltage and a voltage corresponding to a voltage drop caused by the at least one first element.

The reference voltage generation unit may be configured to determine a predetermined voltage for generating the reference voltage.

The reference voltage generation unit may output, as the reference voltage, a voltage obtained from the predetermined voltage by the voltage drop based on a second current flowing through the at least one second element.

The reference voltage generation unit may further include a second current source configured to output the second current.

The reference voltage generation unit may include a resistance element, and a first current source configured to output a first current.

The resistance element may be a variable resistance element configured to be able to adjust a resistance value.

The reference voltage generation unit may be configured to determine the predetermined voltage based on a value of the first current output from the first current source and the resistance value of the resistance element.

The first current source may generate the first current inversely proportional to the resistance value.

The protection circuit may further include a gain setting unit configured to generate the feedback voltage based on the target voltage.

The gain setting unit may include a voltage divider resistor and may generate the feedback voltage by the voltage divider resistor.

The current path unit may include $n_1$ first parallel connection blocks each formed by $m_1$ first elements connected in parallel and may be configured such that the $n_1$ first parallel connection blocks are connected in series.

The reference voltage generation unit may include $n_2$ second parallel connection blocks each formed by $m_2$ second elements connected in parallel and may be configured such that the $n_2$ second parallel connection blocks are connected in series.

A value of a current drawn to the external output terminal may be determined depending on a ratio between the number $m_1$ of the first elements in the current path unit and the number $m_2$ of the second elements in the reference voltage generation unit.

The protection voltage at the external output terminal may be determined depending on a ratio between the number of stages $n_1$ of the first parallel connection blocks in the current path unit and the number of stages $n_2$ of the second parallel connection blocks in the reference voltage generation unit.

Further, the present invention according to another aspect is a protection circuit configured to protect a to-be-protected circuit connected to an external output terminal from overvoltage and including a first protection circuit block configured to protect the to-be-protected circuit from the overvoltage on a positive side, and a second protection circuit block configured to protect the to-be-protected circuit from the overvoltage on a negative side. Each of the first protection circuit block and the second protection circuit block includes a current path unit connected to the external output terminal and including at least one first element, a reference voltage generation unit which generates and outputs a reference voltage, and an amplifier circuit which outputs a target voltage based on a difference between a first input voltage and a second input voltage. The amplifier circuit operates using the reference voltage as the first input voltage and using a feedback voltage based on the target voltage as the second input voltage, and outputs the target voltage to the current path unit. The reference voltage generation unit includes at least one second element having an operating characteristic corresponding to an operating characteristic of the at least one first element of the current path unit, and generates the reference voltage based on a voltage drop caused by the at least one second element.

In this specification and so on, "means" does not only refer to physical means, but also includes a case where the function possessed by the means is realized by software. The function possessed by one means may be realized by two or more physical means, or the function of two or more means may be realized by one physical means. Further, "system" refers to a thing that is a logical collection of a plurality of devices (or functional modules that realize a specific function), and it does not particularly matter whether or not the devices or functional modules are located in a single housing.

Advantageous Effects of Invention

According to the present invention, there is obtained a protection circuit that is not easily affected by process variation or temperature characteristics and thus is high in operation accuracy and that prevents overvoltage on a to-be-protected circuit. Further, according to the present invention, there is obtained a protection circuit that is able to set a protection voltage to a voltage equal to or higher than a power supply voltage and to arbitrarily adjust the protection voltage.

Other technical features, objects, operations and effects, and advantages of the present invention will be clarified by the following embodiments described with reference to the accompanying drawings. The effects described in this specification are by way of example only and are not to be taken by way of limitation, and there may be other effects.

DESCRIPTION OF EMBODIMENTS

Hereinafter, embodiments of the present invention will be described with reference to the drawings. However, the embodiments described below are by way of example only, and there is no intention to exclude the application of various modifications and technologies not explicitly described below. The present invention can be carried out with various modifications (e.g., combinations of the embodiments) within a range not departing from the spirit thereof. In the following description of the drawings, the same or like portions will be denoted by the same or like signs. The drawings are only exemplary, and therefore, the dimensions, the ratios, and so on do not necessarily coincide with actual ones. Further, portions with different dimensional relationships or ratios may be included also between the drawings.

First Embodiment

Figure 1:
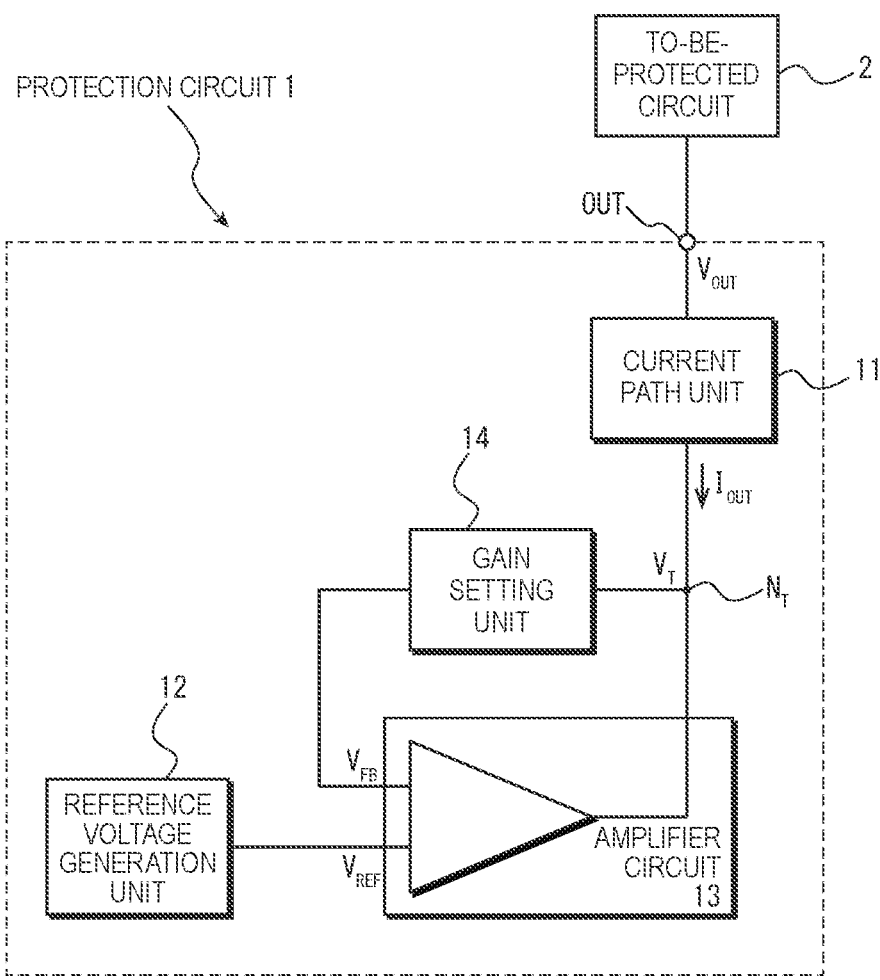
FIG. 1 is a block diagram illustrating an example of a schematic configuration of a protection circuit according to an embodiment of the present invention.

FIG. 1 is a block diagram for illustrating an example of a schematic configuration of a protection circuit according to an embodiment of the present invention. As illustrated in FIG. 1, in general, a protection circuit 1 includes a current path unit 11, a reference voltage generation unit 12, an amplifier circuit 13, and a gain setting unit 14.

The protection circuit 1 is a circuit that prevents the application of a voltage higher than necessary (i.e., an overvoltage) to a to-be-protected circuit 2, for example, due to influence of disturbance. In this disclosure, a threshold voltage before reaching the overvoltage is referred to as a protection voltage ($V_{PROTECT}$). That is, under the circuit design, the protection circuit 1 sets an arbitrary protection voltage to protect the to-be-protected circuit 2 connected to an external output terminal OUT from the overvoltage. As will be described in other embodiments, protection voltages may be set on the positive side and the negative side depending on overvoltages on the positive side and the negative side. As will be described below, the protection circuit 1 of this embodiment is designed to be able to output a desired magnitude of current to the to-be-protected circuit 2 when the output voltage has reached the protection voltage.

In FIG. 1, the current path unit 11 is a circuit in which a path for current to be output to the to-be-protected circuit 2 is formed. The current path unit 11 has one end connected to the external output terminal OUT, and a current $I_{OUT}$ is drawn thereto from the external output terminal OUT. The current path unit 11 is configured to include, for example, at least one element (first element) such as a diode (see FIG. 2). In this embodiment, the current path unit 11 is configured by a plurality of diodes connected in series. This type of diode connection configuration is called a diode string.

The reference voltage generation unit 12 is a circuit that generates and outputs a reference voltage $V_{REF}$ of the amplifier circuit 13. The reference voltage generation unit 12 is configured to include, for example, two current sources independent of each other, a variable resistance element, and at least one element (second element) such as a diode (see FIG. 2). As will be described later, the first current source of the reference voltage generation unit 12 is used for generating a constant voltage $V_B$ from which the reference voltage $V_{REF}$ is derived, whereas the second current source of the reference voltage generation unit 12 is used for determining a current $I_B$ that flows through the second element. The reference voltage $V_{REF}$ is determined by the voltage $V_B$ and a voltage drop caused by the current $I_B$ flowing through the second element. The second element in the reference voltage generation unit 12 is selected so that its operating characteristics are substantially the same as those of the first element in the current path unit 11.

The amplifier circuit 13 is a differential amplifier circuit that outputs a predetermined voltage based on a voltage difference between two input voltages. In this disclosure, the voltage output from the amplifier circuit 13 is referred to as a target voltage $V_T$. As will be described later, the protection voltage $V_{PROTECT}$ is determined by determination of the target voltage $V_T$. The target voltage $V_T$ is fed back to the amplifier circuit 13 as one of the input voltages through a feedback path. That is, using as a first input voltage the reference voltage $V_{REF}$ generated by the reference voltage generation unit 12 and using as a second input voltage a feedback voltage $V_{FB}$ obtained based on the target voltage $V_T$ output from the amplifier circuit 13, the amplifier circuit 13 sequentially outputs the target voltage $V_T$ in such a way that the voltage difference between the first input voltage and the second input voltage becomes zero. A so-called operational amplifier is one example of the amplifier circuit 13.

The gain setting unit 14 is a circuit arranged in the feedback path between the output and the input of the amplifier circuit 13 for setting a gain of the amplifier circuit 13. Herein, assuming that a feedback factor is 1/β, the output voltage of the amplifier circuit 13 (the target voltage $V_T$ in this disclosure) becomes β times the reference voltage $V_{REF}$. The gain setting unit 14 is configured to include, for example, at least one resistance element (see FIG. 2).

Figure 2:
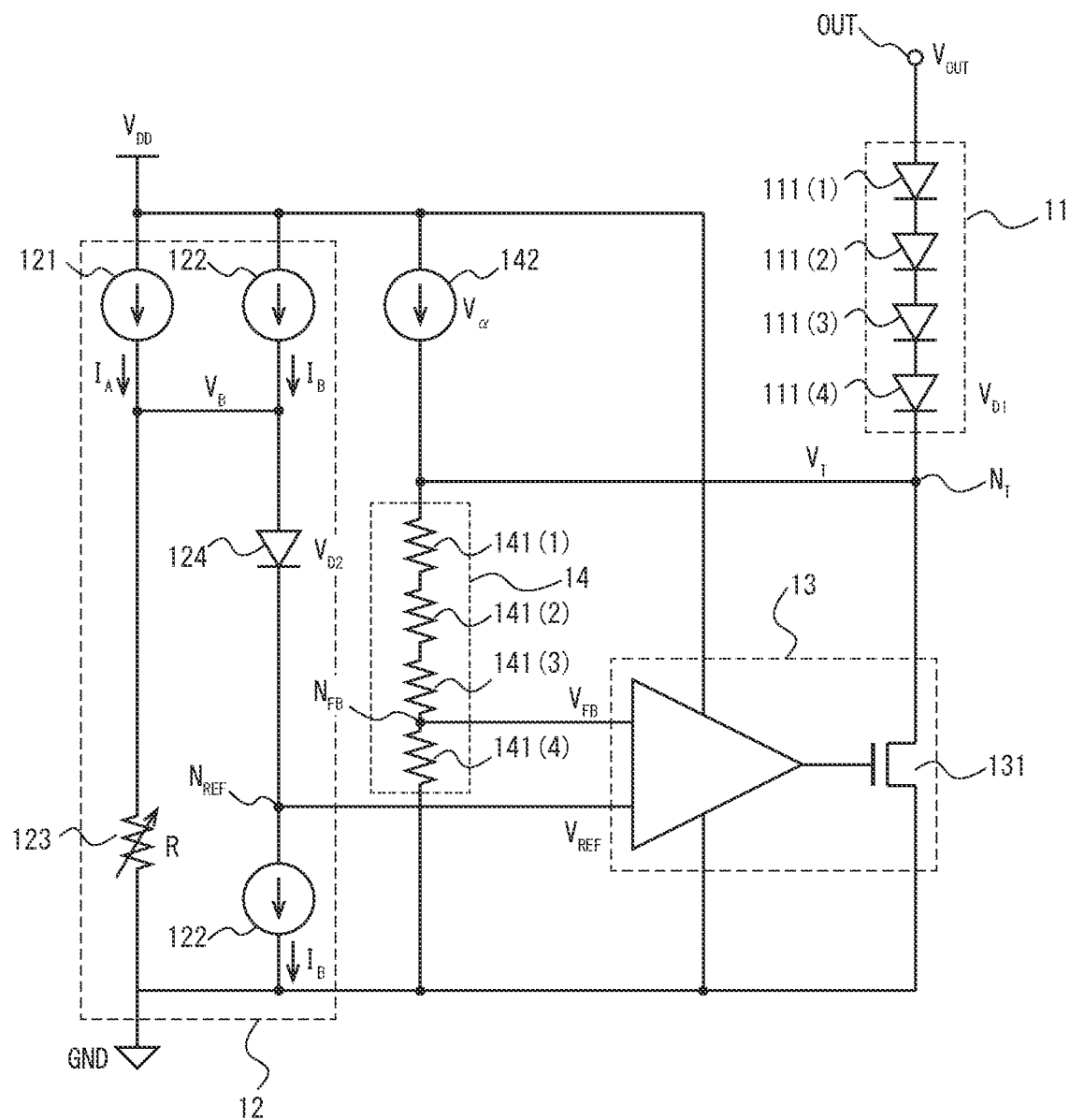
FIG. 2 is a diagram illustrating an example of a specific configuration of the protection circuit according to an embodiment of the present invention.

FIG. 2 is a diagram illustrating an example of a specific configuration of the protection circuit according to the embodiment of the present invention. That is, FIG. 2 illustrates an equivalent circuit of the protection circuit 1 illustrated in FIG. 1.

As illustrated in FIG. 2, the current path unit 11 is configured to include, for example, diodes 111 connected in series. In this disclosure, the diode 111 is one example of the first element. In this example, four diodes 111(1) to 111(4) are connected in series. An anode of the diode 111(1) in a first stage is connected to the external output terminal OUT, and a cathode of the diode 111(4) in a fourth stage is connected to a node $N_T$ where the target voltage $V_T$ appears. In this disclosure, the voltage drop across each of the diodes 111 (a potential difference between the anode and cathode of each diode 111) is defined as $V_{D1}$. Therefore, the potential difference across the four diodes 111(1) to 111(4) is given by $4 \times V_{D1}$ so that the target voltage $V_T$ is given by:

$$V_T = V_{PROTECT} - 4 \times V_{D1}$$

where $V_{PROTECT}$ represents a protection voltage.

The reference voltage generation unit 12 is configured to include, for example, a first current source 121, a second current source 122, a resistance element 123, and a diode 124.

The first current source 121 is a circuit that outputs a current $I_A$ inversely proportional to a resistance value R ($I_A \propto 1/R$). The resistance element 123 is, for example, a variable resistance element that can set an arbitrary resistance value, and determines the voltage $V_B$ based on the current $I_A$ from the first current source 121. The resistance element 123 may be a fixed resistance element with a predetermined resistance value instead of the variable resistance element. In this example, a resistance value of the resistance element 123 when the voltage $V_B$ is obtained by the current $I_A$ is given by R. That is, since the current $I_A$ from the first current source 121 is a current inversely proportional to the resistance value R, if the resistance value of the resistance element 123 is R, the process variations of the resistance elements are cancelled with each other, so that it is possible to obtain the voltage $V_B$ that does not depend on the process variations of the resistance elements.

The second current source 122 is a circuit that outputs the current $I_B$ that flows through the diode 124. In FIG. 2, two second current sources 122 are illustrated. That is, the current $I_B$ that flows through the diode 124 is determined by these second current sources 122. The second current sources 122 are configured to operate independently of the first current source 121.

The diode 124 has an anode connected to an output terminal of the second current source 122 and a cathode connected to a first input terminal of the amplifier circuit 13 through a node $N_{REF}$. In this disclosure, the diode 124 is one example of the second element. The diode 124 is selected so that its operating characteristics are substantially the same as those of the diode 111.

Herein, it is assumed that the potential difference across the diode 124 when the current $I_B$ flows through the diode 124 is defined as $V_{D2}$. While the output terminal of the upper second current source 122 is connected to an output terminal of the first current source 121, the current $I_B$ does not flow to the resistance element 123 due to the lower second current source 122 so that the voltage at the node $N_{REF}$ (i.e., the reference voltage $V_{REF}$) becomes a difference between the voltage $V_B$ and the voltage $V_{D2}$.

As described above, the amplifier circuit 13 is the differential amplifier circuit. While the first input terminal of the amplifier circuit 13 is connected to the node $N_{REF}$ of the reference voltage generation unit 12, a second input terminal of the amplifier circuit 13 is connected to a node $N_{FB}$ of the gain setting unit 14, and an output terminal of the amplifier circuit 13 is connected to a gate of a MOSFET 131. That is, using as a first input voltage the reference voltage $V_{REF}$ appearing at the node $N_{REF}$ and using as a second input voltage the feedback voltage $V_{FB}$ appearing at the node $N_{FB}$, the amplifier circuit 13 operates to sequentially output the target voltage $V_T$ in such a way that the voltage difference between the first input voltage and the second input voltage becomes zero.

The MOSFET 131 is, for example, an n-channel type MOSFET forming the amplifier circuit 13. The MOSFET 131 is configured with its drain connected to the cathode of the diode 111(4) through the node $N_T$ and with its gate arranged at the output terminal of the amplifier circuit 13.

The gain setting unit 14 may be configured in such a way as to include, for example, a voltage divider resistor configured by a plurality of resistance elements 141 connected in series. In this example, four resistance elements 141(1) to 141(4) are connected in series, and the feedback voltage $V_{FB}$ is taken from the node $N_{FB}$ between the resistance element 141(3) in the third stage and the resistance element 141(4) in the fourth stage. That is, the feedback voltage $V_{FB}$ is given by $V_T \times \frac{1}{4}$.

A voltage $V_\alpha$ represents a voltage at which a current source 142 can operate. Therefore, when the power supply voltage of the protection circuit 1 is given by $V_{DD}$, the protection circuit 1 operates under a condition of:

$$V_{DD} > V_T + V_\alpha.$$

In the protection circuit 1 configured as described above, the operating characteristics of the diode 111 and the diode 124 are substantially the same as each other. As described above, the reference voltage $V_{REF}$ is given by:

$$V_{REF} = V_B - V_{D2}.$$

Further, $V_{FB} = V_{REF}$ by the operating characteristics of the amplifier circuit 13, and the target voltage $V_T$ is given by:

$$V_T = 4 \times V_{FB}.$$

Therefore, an output voltage $V_{OUT}$ at the external output terminal OUT is given by:

$$V_{OUT} = V_T + 4 \times V_{D1}$$
$$= 4 \times V_B + 4 \times V_{D1} - 4 \times V_{D2}.$$

Specifically, at normal times, the to-be-protected circuit 2 operates at the output voltage $V_{OUT}$ in a range smaller than $4 \times V_B$ ($V_{OUT} < 4 \times V_B$). Then, when an overvoltage at which the output voltage $V_{OUT}$ is $4 \times V_B$ or higher ($V_{OUT} \geq 4 \times V_B$) is applied to the to-be-protected circuit 2, the protection circuit 1 functions for protecting the to-be-protected circuit 2. That is, when the output voltage $V_{OUT}$ has reached $4 \times V_B$, the relationship between the current $I_B$ and the output current $I_{OUT}$ is given by:

$$I_{OUT} = I_B.$$

As described above, in this example, the operating characteristics of the diode 111 and the diode 124 are substantially the same as each other. Therefore, when the output voltage $V_{OUT}$ is $4 \times V_B$, the output current $I_{OUT}$ equal to the current $I_B$ is obtained.

As described above, according to this embodiment, the protection circuit 1 is configured such that the protection voltage for protecting the to-be-protected circuit 2 from the overvoltage can be set to a voltage higher than the power supply voltage $V_{DD}$. In other words, the protection circuit 1 is able to set the protection voltage to a voltage higher than the target voltage $V_T$ by a voltage difference corresponding to the number of diodes 111 (in this example, $4 \times V_{D1}$).

According to this embodiment, the circuit configuration is such that the output voltage $V_{OUT}$ depends on the voltage $V_B$ and that the voltage $V_B$ is determined by the resistance value R, and therefore, the output voltage $V_{OUT}$ can be set accurately (e.g., per unit of several mV) differently from the conventional configuration in which the voltage is set corresponding to the number of connection stages of diodes (the number of diodes).

Further, in the protection circuit 1, the MOSFET 131 can be selected taking into account the target voltage $V_T$ ($V_{PROTECT} = 4 \times V_{D1}$) and the feedback voltage $V_{FB}$ (($V_{PROTECT} - 4 \times V_{D1}$)/4), and therefore, the MOSFET 131 with a low rated voltage can be employed, so that the degree of freedom of design is ensured. Likewise, choices of the amplifier circuit 13 and the current source 142 are also expanded so that the degree of freedom of design is ensured.

Second Embodiment

This embodiment is a modification of the first embodiment and has a feature in that the magnitudes of the protection voltage and the drawn current can be optimized by the configuration of first elements in a current path unit and a configuration of second elements in a reference voltage generation unit corresponding to the configuration of the first elements.

Figure 3:
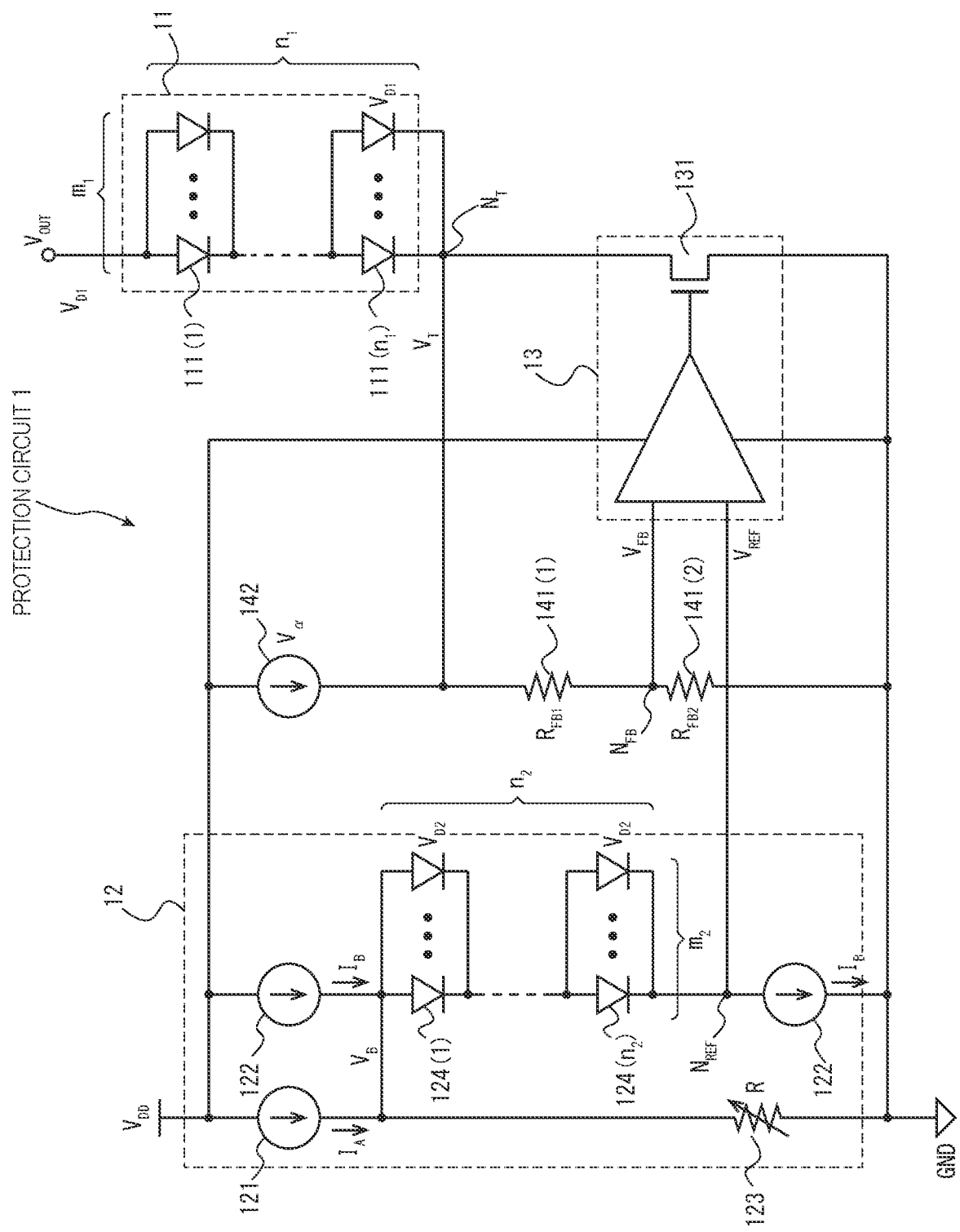
FIG. 3 is a diagram illustrating an example of a specific configuration of a protection circuit according to an embodiment of the present invention.

FIG. 3 is a diagram illustrating an example of a specific configuration of a protection circuit according to this embodiment. As illustrated in FIG. 3, a current path unit 11 has a configuration in which groups of a plurality of diodes 111 connected in parallel are connected in series. Likewise, a reference voltage generation unit 12 has a configuration in which groups of a plurality of diodes 124 connected in parallel are connected in series. Further, in FIG. 3, a voltage divider resistor in a gain setting unit 14 is illustrated as resistance elements 141(1), 141(2).

Specifically, the current path unit 11 of this embodiment has a configuration in which parallel connection blocks (first parallel connection blocks) each formed by $m_1$ diodes 111 connected in parallel are connected in series in $n_1$ stages. That is, the current path unit 11 is configured to include $m_1 \times n_1$ diodes 111.

On the other hand, the reference voltage generation unit 12 has a configuration in which parallel connection blocks (second parallel connection blocks) each formed by $m_2$ diodes 124 connected in parallel are connected in series in $n_2$ stages. That is, the reference voltage generation unit 12 is configured to include $m_2 \times n_2$ diodes 124. The operating characteristics of each of the diodes 111 and each of the diodes 124 are substantially the same as each other.

It is assumed that the resistance values of the resistance elements 141(1), 141(2) in the gain setting unit 14 are respectively given by $R_{FB1}$ and $R_{FB2}$. A feedback voltage $V_{FB}$ is given by:

$$V_{FB} = V_T \times R_{FB2}/(R_{FB1} + R_{FB2}).$$

Therefore, the resistance values of $R_{FB1}$ and $R_{FB2}$ are determined so that the relationship between the numbers of stages $n_1$ and $n_2$ of the parallel connection blocks is given by:

$$n_2/n_1 = R_{FB2}/(R_{FB1} + R_{FB2}).$$

Therefore, when an output voltage $V_{OUT}$ is given by:

$$V_{OUT} = V_B \times (n_1/n_2),$$

$$I_{OUT} = I_B \times (m_1/m_2) \text{ is obtained.}$$

That is, the protection voltage can be increased with respect to the voltage $V_B$ by increasing the ratio $(n_1/n_2)$ between the numbers of stages $n_1$ and $n_2$ of the parallel connection blocks. Further, the current $I_{OUT}$ drawn to the protection circuit 1 can be increased with respect to the current $I_B$ by increasing the ratio $(m_1/m_2)$ between the number $m_1$ of the diodes 111 connected in parallel and the number $m_2$ of the diodes 124 connected in parallel.

The protection circuit 1 of the first embodiment is the configuration when $m_1/m_2 = 1$, and $n_1/n_2 = 4$.

As described above, according to this embodiment, it is possible to obtain advantageous effects similar to those of the first embodiment. Among others, according to this embodiment, based on the ratio $(n_1/n_2)$ between the numbers of stages of the parallel connection blocks and the ratio ($m_1/m_2$) between the number of the diodes 111 connected in parallel and the number of the diodes 124 connected in parallel in the current path unit 11 and the reference voltage generation unit 12, it is possible to arbitrarily adjust the protection voltage and the drawn current amount of the protection circuit 1.

Third Embodiment

This embodiment is a modification of the first embodiment and has a feature in that protection voltages on the positive side and the negative side can be set corresponding to overvoltages on the positive side (upper limit side) and the negative side (lower limit side) of a to-be-protected circuit.

Figure 4:
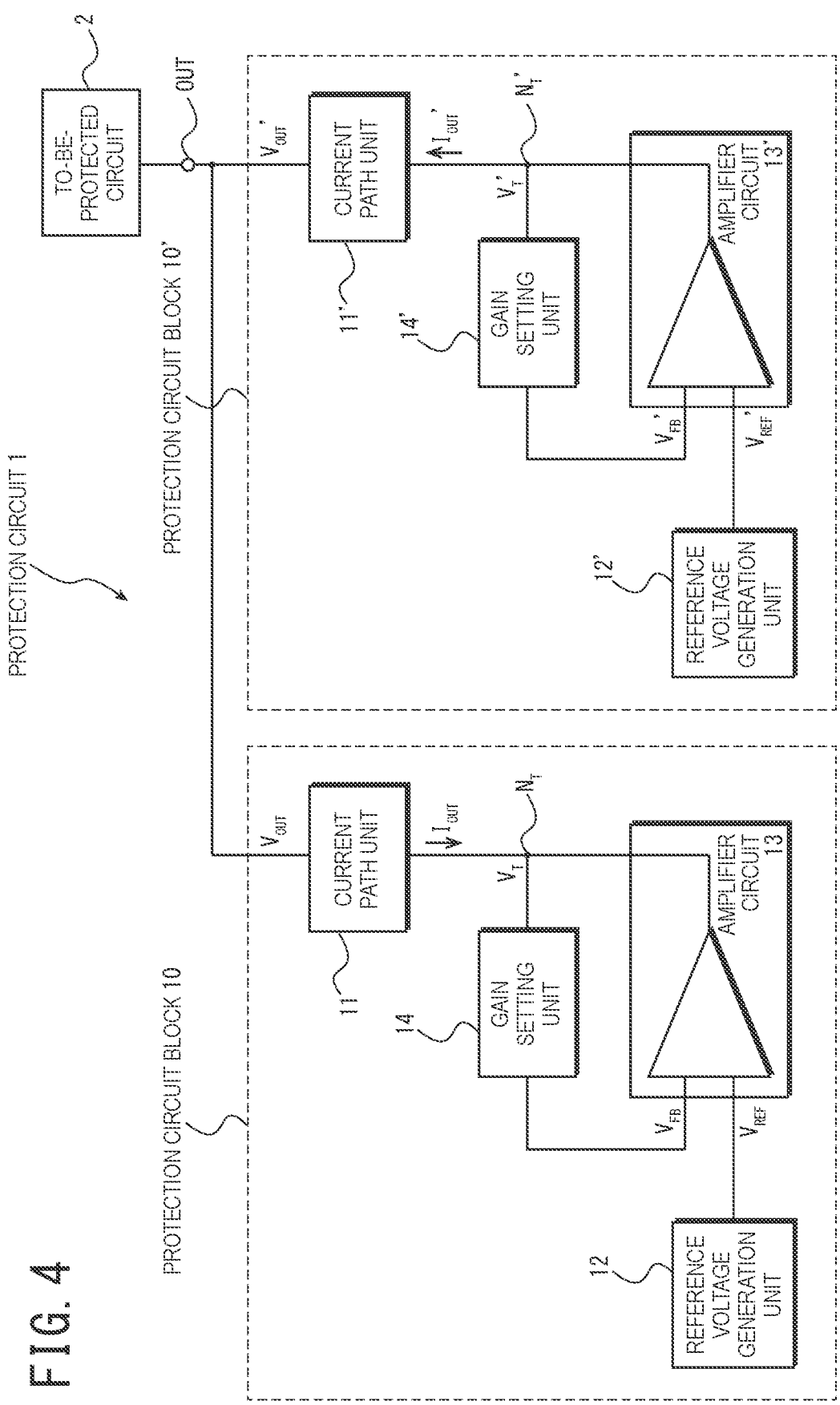
FIG. 4 is a block diagram illustrating an example of a schematic configuration of a protection circuit according to an embodiment of the present invention.

FIG. 4 is a diagram illustrating an example of a schematic configuration of a protection circuit according to this embodiment. As illustrated in FIG. 4, a protection circuit 1 of this embodiment is configured to include two circuit blocks, i.e., a first protection circuit block 10 and a second protection circuit block 10'. As will be described below, the first protection circuit block 10 and the second protection circuit block 10' are configured symmetrically to each other so as to correspond to positive and negative voltages.

Figure 5:
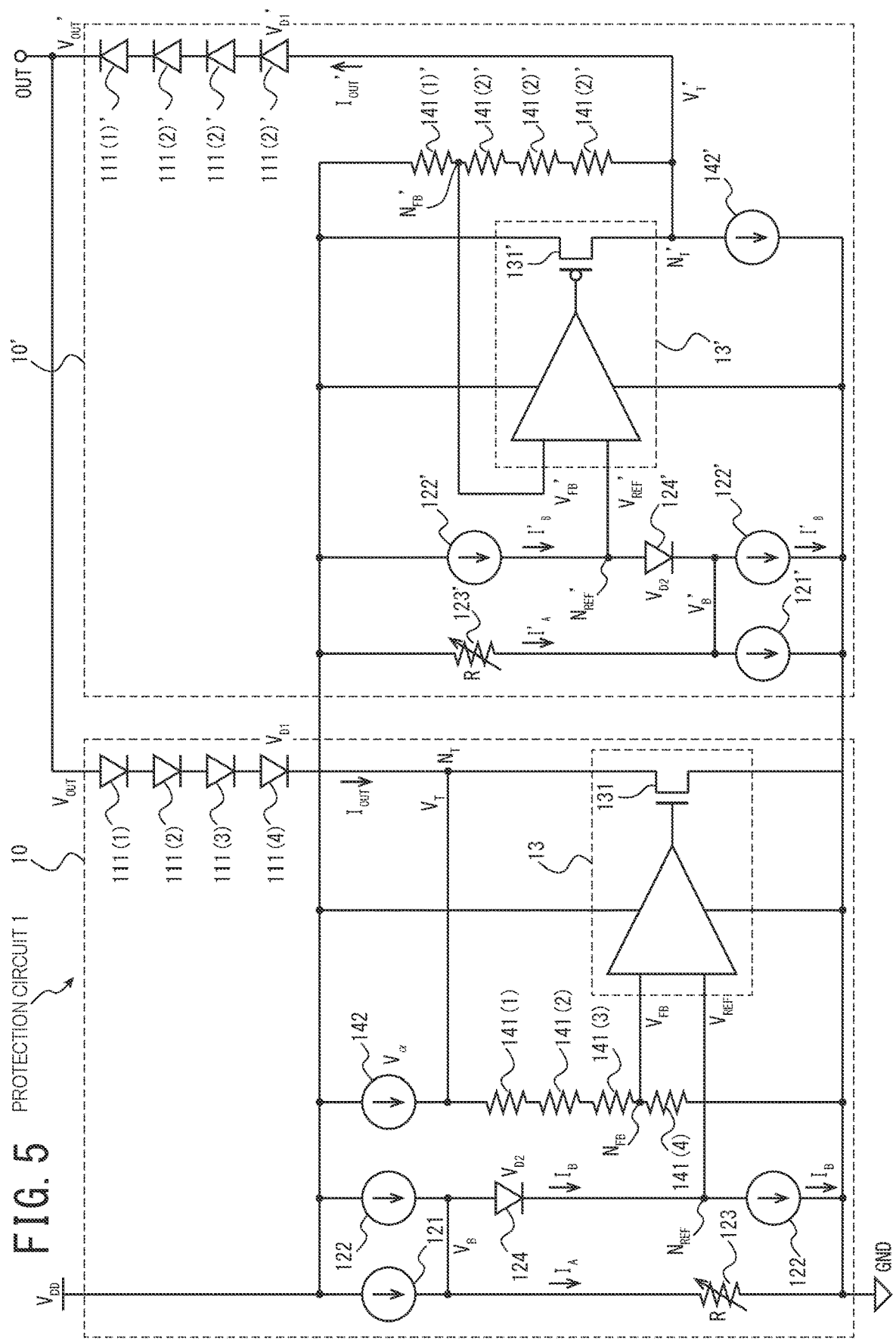
FIG. 5 is a diagram illustrating an example of a specific configuration of the protection circuit according to an embodiment of the present invention.

FIG. 5 is a diagram illustrating an example of a specific configuration of the protection circuit according to this embodiment. In FIG. 5, the first protection circuit block 10 has the same circuit configuration as illustrated in FIG. 2, and therefore, a description thereof is omitted.

A basic circuit configuration of the second protection circuit block 10' is the same as that of the first protection circuit block 10, but, in order to set the protection voltage on the negative side, the direction of diodes 111' in a current path unit 11' is reversed, and following this, some elements are also configured symmetrically with respect to positive and negative voltages.

In the second protection circuit block 10', a reference voltage $V_{REF}'$ is given by:

$$V_{REF}' = V_B' + V_{D2}'.$$

Further, a feedback voltage $V_{FB}'$ is given by:

$$V_{FB}' = V_T' + 3/4 \times V_{DD} - 3/4 \times V_T'$$
$$= 3/4 \times V_{DD} + V_T'/4$$

Therefore, an output voltage $V_{OUT}'$ is given by:

$$V_{OUT}' = V_T' - 4 \times V_{D1}'.$$

Since $V_B' + V_{D2}' = 3/4 \times V_{DD} + V_{OUT}'/4 + V_{D1}'$, $$V_{OUT}' = -3 \times V_{DD} + 4 \times V_B' - 4 \times V_{D1}' + 4 \times V_{D2}'$$

is obtained.

Specifically, in a normal state, a to-be-protected circuit 2 operates at the output voltage $V_{OUT}'$ in a range greater than $4 \times V_B' - 3 \times V_{DD}$ ($V_{OUT}' > 4 \times V_B' - 3 \times V_{DD}$). Then, when an overvoltage on the negative side at which the output voltage $V_{OUT}'$ is equal to or less than $4 \times V_B' - 3 \times V_{DD}$ ($V_{OUT}' \leq 4 \times V_B' - 3 \times V_{DD}$) is applied to the to-be-protected circuit 2, the protection circuit 1 functions for protecting the to-be-protected circuit 2. That is, when the output voltage $V_{OUT}'$ has reached $4 \times V_B' - 3 \times V_{DD}$, the relationship between a current $I_B'$ and an output current $I_{OUT}'$ is given by:

$$I_{OUT}' = I_B'.$$

That is, in the second protection circuit block 10' that sets the protection voltage on the negative side, when the output voltage $V_{OUT}'$ is $4 \times V_B' - 3 \times V_{DD}$, the output current $I_{OUT}'$ equal to the current $I_B'$ can be obtained.

As described above, according to this embodiment, it is possible to obtain advantageous effects similar to those of the embodiments described above. In particular, according to this embodiment, since the second protection circuit block 10' that sets the protection voltage on the negative side for the to-be-protected circuit 2 is further provided, it is possible to reliably protect the to-be-protected circuit 2 from the positive and negative overvoltages.

Fourth Embodiment

This embodiment is a modification of the above-described embodiments and has a feature in that while protection voltages on the positive side and the negative side are set corresponding to overvoltages on the positive side and the negative side of a to-be-protected circuit, it is possible to optimize the magnitudes of the protection voltages and the drawn current.

Figure 6:
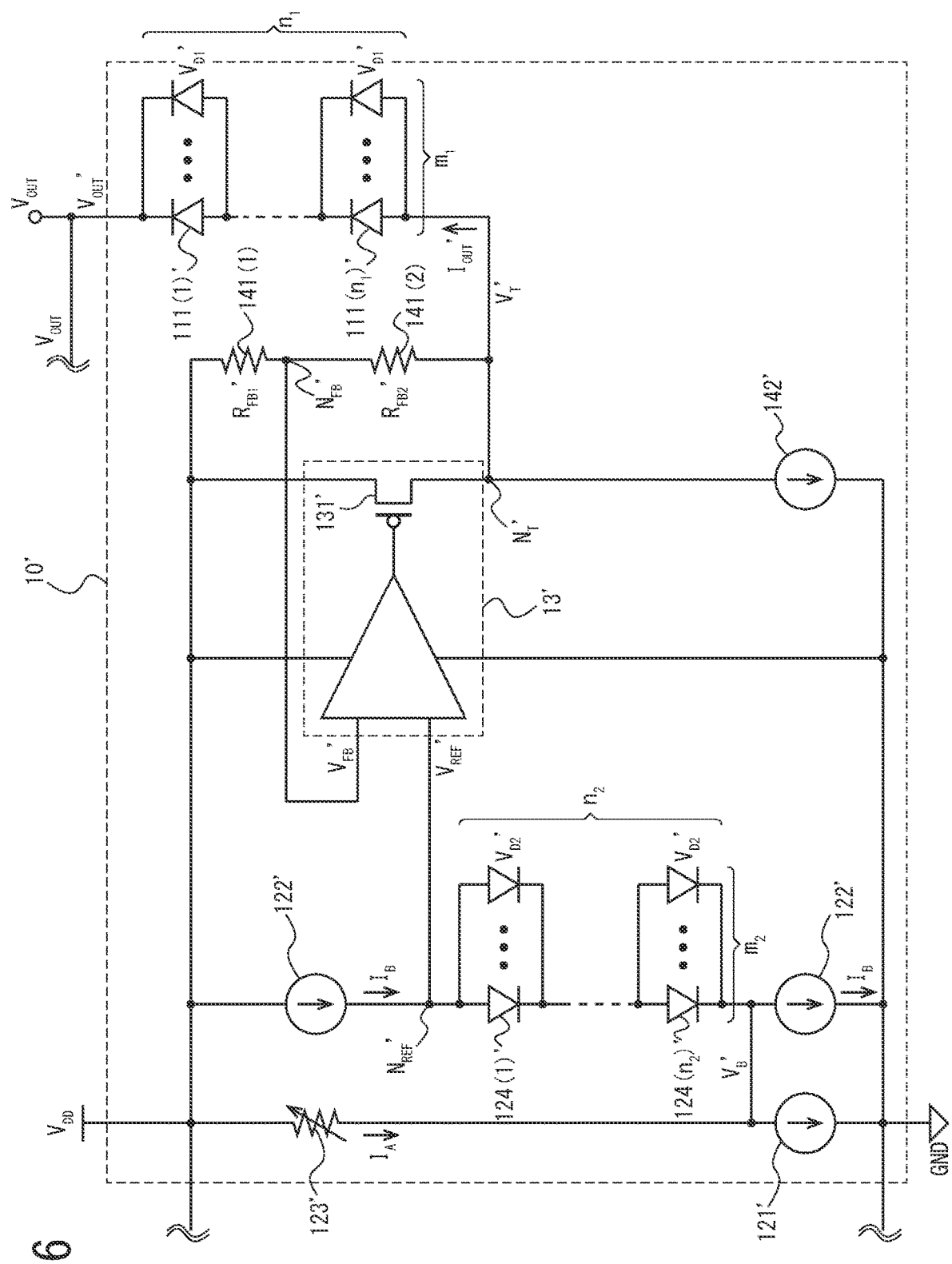
FIG. 6 is a diagram illustrating an example of part of a specific configuration of a protection circuit according to an embodiment of the present invention.

FIG. 6 is a diagram illustrating one example of part of a specific configuration of a protection circuit according to this embodiment. That is, in FIG. 6, in a protection circuit 1 including a first protection circuit block 10 that sets the protection voltage on the positive side, and a second protection circuit block 10' that sets the protection voltage on the negative side, only the second protection circuit block 10' is illustrated. Since the first protection circuit block 10 has the same circuit configuration as illustrated in FIG. 3, a description thereof is omitted. Although not illustrated, as understood by those skilled in the art reading this disclosure, the second protection circuit block 10' includes a current path unit 11', a reference voltage generation unit 12', an amplifier circuit 13', and a gain setting unit 14'.

As illustrated in FIG. 6, in the protection circuit 1 of this embodiment, the current path unit 11' of the second protection circuit block 10' has a configuration in which groups of a plurality of diodes 111' connected in parallel are connected in series (cascade connection). Likewise, the reference voltage generation unit 12' has a configuration in which groups of a plurality of diodes 124' connected in parallel are connected in series. Further, in FIG. 6, a voltage divider resistor in the gain setting unit 14 is illustrated as resistance elements 141(1)', 141(2)'.

Specifically, the current path unit 11' of this embodiment has a configuration in which parallel connection blocks each formed by $m_1$ ($m_1 \geq 1$) diodes 111' connected in parallel are connected in series in $n_1$ ($n_1 \geq 1$) stages. That is, the current path unit 11' is configured to include $m_1 \times n_1$ diodes 111'.

On the other hand, the reference voltage generation unit 12' has a configuration in which parallel connection blocks each formed by $m_2$ ($m_2 \geq 1$) diodes 124' connected in parallel are connected in series in $n_2$ ($n_2 \geq 1$) stages. That is, the reference voltage generation unit 12' is configured to include $m_2 \times n_2$ diodes 124'. The operating characteristics of each of the diodes 111' and each of the diodes 124' are substantially the same as each other.

A reference voltage $V_{REF}'$ by the reference voltage generation unit 12' is given by:

$$V_{REF}' = V_B' + n_2 \times V_{D2}'.$$

Herein, the resistance values of $R_{FB1}'$ and $R_{FB2}'$ are determined so that the relationship between the numbers of stages $n_1$ and $n_2$ of the parallel connection blocks is given by:

$$n_2/n_1 = R_{FB1}'/(R_{FB1}' + R_{FB2}').$$

It is assumed that the resistance values of the resistance elements 141(1)', 141(2)' in the gain setting unit 14' are respectively given by $R_{FB1}{}'$ and $R_{FB2}{}'$. A feedback voltage $V_{FB}{}'$ is given by:

$$V'_{FB} = V'_T + R'_{FB2}/(R'_{FB1} + R'_{FB2}) \times (V_{DD} - V'_T)$$
$$= \{(n_1 - n_2)/n_1\} \times V_{DD} + n_2/n_1 \times V'_T$$

Therefore, a target voltage $V_T{}'$ is given by:

$$V_T' = n_1/n_2 \times V_{FB}' + \{(n_2 - n_1)/n_2\} \times V_{DD}.$$

Therefore, an output voltage $V_{OUT}{}'$ is given by:

$$V'_{OUT} = V'_T - n_1 \times V'_{D1}$$
$$= n_1/n_2 \times V'_B + \{(n_2 - n_1)/n_2\} \times V_{DD} + n_1 \times V'_{D2} - n_1 \times V'_{D1}.$$

Therefore, when the output voltage $V_{OUT}{}'$ is given by:

$$V_{OUT}' = n_1/n_2 \times V_B' + \{(n_2 - n_1)/n_2\} \times V_{DD},$$

$$I_{OUT}' = I_B' \times (m_1/m_2) \text{ is obtained.}$$

Therefore, when the output voltage $V_{OUT}{}'$ is given by:

$$V_{OUT}' = (n_1/n_2) \times V_B' + \{(n_2 - n_1)/n_2\} \times V_{DD},$$

the relationship between the current $I_B{}'$ and the output current $I_{OUT}{}'$ is given by:

$$I_{OUT}' = I_B' \times (m_1/m_2).$$

That is, the protection voltage can be increased to the negative side with respect to the voltage $V_B{}'$ by increasing the ratio ($n_1/n_2$) between the numbers of stages $n_1$ and $n_2$ of the parallel connection blocks. Further, the current $I_{OUT}{}'$ drawn to the protection circuit 1 can be increased to the negative side with respect to the current $I_B{}'$ by increasing the ratio ($m_1/m_2$) between the number $m_1$ of the diodes 111' connected in parallel and the number $m_2$ of the diodes 124' connected in parallel.

In this embodiment, the configuration of the diodes 111' (i.e., the number of the diodes 111' connected in parallel and the number of the stages) in the current path unit 11' in the second protection circuit block 10' and the configuration of the diodes 124' (i.e., the number of the diodes 124' connected in parallel and the number of the stages) in the reference voltage generation unit 12' in the second protection circuit block 10' are the same as those in the first protection circuit block 10, but the present invention is not limited thereto.

(Simulation Results)

A simulation was performed for the operating characteristics (process variation and temperature variation) of the protection circuit 1 according to the first embodiment (see FIG. 2). For comparison, a simulation was performed for the operating characteristics of a protection circuit with a conventional diode string configuration (hereinafter referred to as the "conventional protection circuit"). In each of the conventional protection circuit and the protection circuit 1 according to the first embodiment, the diode string configuration had four stages.

In each of the simulations, in order to evaluate the process variation and the temperature variation, use was made of protection circuits respectively formed by process fast (Process Fast) diodes and process slow (Process Slow) diodes. A process fast semiconductor (diode in this example) refers to a semiconductor in which the amount of doping is large at a p-n junction in the semiconductor manufacturing process, and a process slow semiconductor refers to a semiconductor in which the amount of doping is small at a p-n junction in the semiconductor manufacturing process.

Figure 7A:
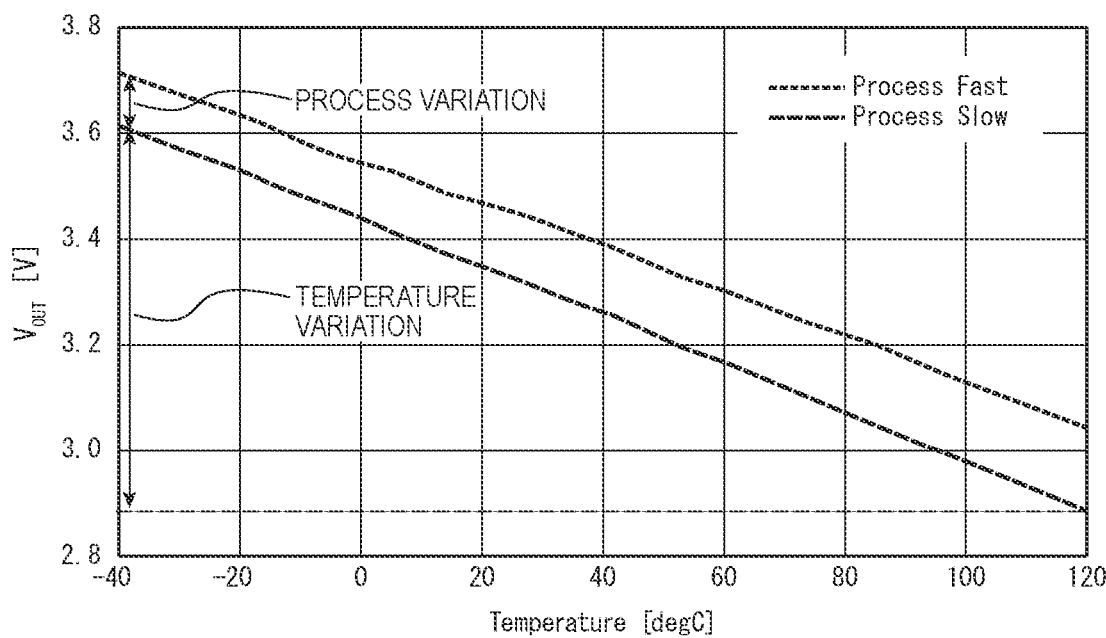
FIGS. 7A and 7B show for illustrating results of simulations of the protection circuit according to an embodiment of the present invention.
Figure 7B:
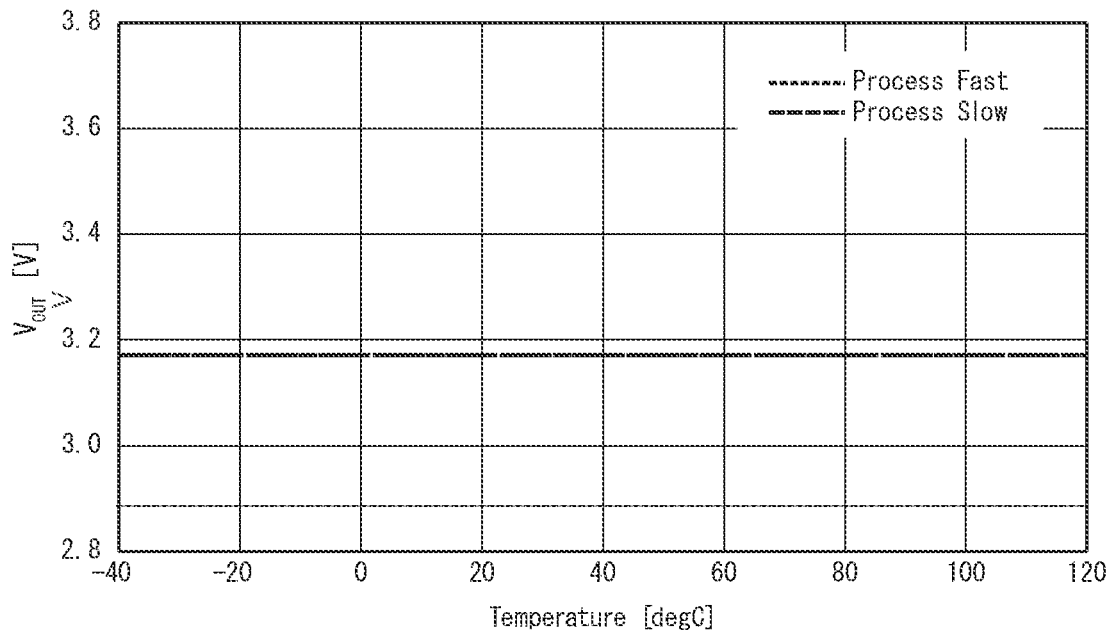

FIGS. 7A and 7B are diagrams for explaining the results of the simulations of the conventional protection circuit and the protection circuit according to the first embodiment. FIG. 7A is a graph illustrating the relationship between the temperature and the output voltage in the conventional protection circuit. As illustrated in FIG. 7A, the output voltage difference between the conventional process-fast protection circuit and the conventional process-slow protection circuit was about 0.1 V. Further, the change in output voltage was about 0.7 V with respect to a temperature change from −40 degrees to +120 degrees.

On the other hand, FIG. 7B is a graph illustrating the relationship between the temperature and the output voltage in the protection circuit 1 according to the first embodiment (see FIG. 2). As illustrated in FIG. 7B, almost no process variation or temperature variation was observed in the protection circuit 1 according to the first embodiment.

Consequently, in the protection circuit 1 according to the first embodiment, it was possible to suppress the process variation and the temperature variation by 99% or more.

As described above, according to this embodiment, it is possible to obtain advantageous effects similar to those of the embodiments described above. In particular, according to this embodiment, also in the second protection circuit block 10' that sets the protection voltage on the negative side for the to-be-protected circuit 2, it is possible to arbitrarily adjust the protection voltage and the drawn current amount on the negative side of the protection circuit 1.

The embodiments described above are only by way of example for explaining the present invention and are not intended to limit the present invention only to these embodiments. The present invention can be carried out in various modes as long as not departing from the gist thereof.

For example, in a method disclosed in this specification, steps, operations, or functions may be performed in parallel or in different order as long as no contradiction arises in the results. The described steps, operations, and functions are provided by way of example only. Some of the steps, operations, and functions may be omitted or combined together to be one within a range not departing from the gist of the invention, or other steps, operations, or functions may be added.

While various embodiments are disclosed in this specification, a specific feature (technical matter) of one of the embodiments may be improved as appropriate and added to another of the embodiments or substituted for a specific feature in another of the embodiments. Such a mode is also included in the gist of the present invention.

A function of an element disclosed herein may be implemented using a general purpose processor, a special purpose processor, an integrated circuit, an application specific integrated circuit (ASIC), or a conventional circuit configuration, that is configured to perform the disclosed element or programmed to perform the disclosed function, and/or a circuit configuration or a processing circuit configuration including a combination of them. A processor is regarded as a processing circuit configuration or a circuit configuration when it includes transistors and another circuit configuration. In this disclosure, a circuit configuration, a unit, or a means is hardware that performs a specific function or that is programmed to perform the function. Hardware may be any hardware disclosed herein or known other hardware that is programmed to perform a specific function or that is configured to perform the function. When hardware is a processor that may be regarded as a certain type of circuit configuration, a circuit configuration, a means, or a unit is a combination of hardware and software, or software used for forming hardware, and/or a processor.

REFERENCE SIGNS LIST 1 protection circuit
10 first protection circuit block
10' second protection circuit block
11, 11' current path unit
  111, 111' diode
12, 12' reference voltage generation unit
  121, 121' first current source
  122, 122' second current source
  123, 123' resistance element
  124, 124' diode
13, 13' amplifier circuit
  131, 131' MOSFET
14, 14' gain setting unit
  141, 141' resistance element
  142, 142' current source

The invention claimed is:

1. A protection circuit configured to protect a to-be-protected circuit connected to an external output terminal from overvoltage, comprising:
a current path unit connected to the external output terminal and including at least one first element;
a reference voltage generation unit which generates and outputs a reference voltage; and
an amplifier circuit which outputs a target voltage based on a difference between a first input voltage and a second input voltage,
wherein the amplifier circuit operates using the reference voltage as the first input voltage and using a feedback voltage based on the target voltage as the second input voltage, and outputs the target voltage to the current path unit, and
the reference voltage generation unit includes at least one second element having one or more operating characteristics corresponding to one or more operating characteristics of the at least one first element of the current path unit,
wherein the reference voltage generation unit generates the reference voltage based on a voltage drop caused by the at least one second element.

2. The protection circuit according to claim 1, wherein the current path unit determines a protection voltage at the external output terminal based on the target voltage and a voltage corresponding to a voltage drop caused by the at least one first element.

3. The protection circuit according to claim 1, wherein the reference voltage generation unit is configured to determine a predetermined voltage for generating the reference voltage.

4. The protection circuit according to claim 3, wherein the reference voltage generation unit outputs, as the reference voltage, a voltage obtained from the predetermined voltage by the voltage drop based on a second current flowing through the at least one second element.

5. The protection circuit according to claim 4, wherein the reference voltage generation unit further includes a second current source which outputs the second current.

6. The protection circuit according to claim 1, wherein the reference voltage generation unit includes:
a resistance element; and
a first current source configured to output a first current.

7. The protection circuit according to claim 6, wherein the resistance element is a variable resistance element configured to be able to adjust a resistance value.

8. The protection circuit according to claim 7, wherein the reference voltage generation unit determines the predetermined voltage based on a value of the first current output from the first current source and the resistance value of the resistance element.

9. The protection circuit according to claim 7, wherein the first current source is configured to generate the first current inversely proportional to the resistance value.

10. The protection circuit according to claim 1, further comprising a gain setting unit configured to generate the feedback voltage based on the target voltage.

11. The protection circuit according to claim 10, wherein the gain setting unit includes a voltage divider resistor and generates the feedback voltage by the voltage divider resistor.

12. The protection circuit according to claim 1, wherein the current path unit includes $n_1$ first parallel connection blocks each formed by $m_1$ first elements connected in parallel and is configured such that the $n_1$ first parallel connection blocks are connected in series.

13. The protection circuit according to claim 12, wherein the reference voltage generation unit includes $n_2$ second parallel connection blocks each formed by $m_2$ second elements connected in parallel, and is configured such that the $n_2$ second parallel connection blocks are connected in series.

14. The protection circuit according to claim 13, wherein a value of a current drawn to the external output terminal is determined depending on a ratio between the number $m_1$ of the first elements in the current path unit and the number $m_2$ of the second elements in the reference voltage generation unit.

15. The protection circuit according to claim 13, wherein the protection voltage at the external output terminal is determined depending on a ratio between the number of stages $n_1$ of the first parallel connection blocks in the current path unit and the number of stages $n_2$ of the second parallel connection blocks in the reference voltage generation unit.

16. A protection circuit according to claim 1, wherein the one or more operating characteristics including a process variation and a temperature variation of the second element are selected to be substantially same as the one or more operating characteristics including a process variation and a temperature variation of the first element.

17. A protection circuit configured to protect a to-be-protected circuit connected to an external output terminal from overvoltage comprising:
a first protection circuit block which protects the to-be-protected circuit from the overvoltage on a positive side; and
a second protection circuit block which protects the to-be-protected circuit from the overvoltage on a negative side,
wherein each of the first protection circuit block and the second protection circuit block includes:
a current path unit connected to the external output terminal and including at least one first element;
a reference voltage generation unit which generates and outputs a reference voltage; and
an amplifier circuit which outputs a target voltage based on a difference between a first input voltage and a second input voltage, and
wherein the amplifier circuit operates using the reference voltage as the first input voltage and using a feedback voltage based on the target voltage as the second input voltage, and outputs the target voltage to the current path unit, and the reference voltage generation unit includes at least one second element having one or more operating characteristics corresponding to one or more operating characteristics of the at least one first element of the current path unit, wherein the reference voltage generation unit generates the reference voltage based on a voltage drop caused by the at least one second element.

* * * * *